United States Patent
Lee et al.

(10) Patent No.: US 10,075,147 B2
(45) Date of Patent: Sep. 11, 2018

(54) ACOUSTIC RESONATOR AND METHOD OF MANUFACTURING THE SAME

(71) Applicant: Samsung Electro-Mechanics Co., Ltd., Suwon-Si (KR)

(72) Inventors: Moon Chul Lee, Suwon-Si (KR); Jea Shik Shin, Suwon-Si (KR); Young Gyu Lee, Suwon-Si (KR); Ho Soo Park, Suwon-Si (KR); Duck Hwan Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 568 days.

(21) Appl. No.: 14/642,054

(22) Filed: Mar. 9, 2015

(65) Prior Publication Data
US 2016/0035960 A1 Feb. 4, 2016

(30) Foreign Application Priority Data
Jul. 31, 2014 (KR) .......................... 10-2014-0098124

(51) Int. Cl.
*H03H 9/17* (2006.01)
*H03H 3/02* (2006.01)

(52) U.S. Cl.
CPC ....... *H03H 9/173* (2013.01); *H03H 2003/021* (2013.01)

(58) Field of Classification Search
CPC ............ H03H 9/173; H03H 9/15; H03H 9/17; H03H 9/171; H03H 9/172; H03H 9/174; H03H 9/175
USPC ...................................................... 310/320
See application file for complete search history.

(56) References Cited

U.S. PATENT DOCUMENTS

| | | | |
|---|---|---|---|
| 2012/0161902 A1 | 6/2012 | Feng et al. | |
| 2012/0218059 A1* | 8/2012 | Burak | H03H 9/132 333/191 |
| 2014/0139077 A1* | 5/2014 | Choy | H03H 9/02118 310/365 |

FOREIGN PATENT DOCUMENTS

JP 2013-138425 A 7/2013

* cited by examiner

*Primary Examiner* — Derek Rosenau
(74) *Attorney, Agent, or Firm* — NSIP Law

(57) ABSTRACT

An acoustic resonator is provided in which loss of acoustic waves in a transverse direction may be reduced through a cavity formed in an acoustic resonance unit including a first electrode, a piezoelectric layer, and a second electrode, and in which acoustic waves in a longitudinal direction may be reduced by forming an air gap between the acoustic resonance unit and a substrate. Whereby, a quality factor may be improved.

15 Claims, 6 Drawing Sheets

ACOUSTIC RESONATOR AND METHOD OF MANUFACTURING THE SAME

CROSS-REFERENCE TO RELATED APPLICATION

This application claims the priority and benefit of Korean Patent Application No. 10-2014-0098124 filed on Jul. 31, 2014, with the Korean Intellectual Property Office, the disclosure of which is incorporated herein by reference.

BACKGROUND

The present disclosure relates to an acoustic resonator and a method of manufacturing the same.

Currently, in accordance with the rapid development of communications technologies, developments in the area of signal processing technology and radio frequency (RF) component technology have been required, accordingly.

Particularly, in accordance with the trend for the miniaturization of wireless communications devices, the miniaturization of radio frequency component technology has been actively required, and here, among radio frequency components, the miniaturization of a filter has been realized by manufacturing a filter in the form of a bulk acoustic wave (BAW) resonator using a technology of manufacturing a semiconductor thin film wafer.

A bulk acoustic wave (BAW) resonator is a resonator in which a thin film type of element causing resonance by depositing a piezoelectric dielectric material on a silicon wafer, a semiconductor substrate, and using piezoelectric characteristics thereof, is implemented as the filter.

Examples of the usage of bulk acoustic wave (BAW) resonators include applications as small and lightweight filters in devices such as mobile communications devices, chemical and biological testing devices, and the like, as well as in oscillators, resonance elements, acoustic resonance mass sensors, and the like.

Meanwhile, a research into various structural shapes and functions for increasing characteristics of the bulk acoustic wave resonator has been performed, and particularly, a research into reducing loss of acoustic waves in a longitudinal direction and a transverse direction is required.

SUMMARY

An aspect of the present disclosure may provide an acoustic resonator and a method of manufacturing the same, in which loss of acoustic waves in a longitudinal direction and a transverse direction may be reduced and a quality factor may be improved.

According to an aspect of the present disclosure, an acoustic resonator may reduce loss of acoustic waves in a transverse direction through a cavity formed in an acoustic resonance unit including a first electrode, a piezoelectric layer, and a second electrode, and may reduce loss of acoustic waves in a longitudinal direction by forming an air gap between the acoustic resonance unit and a substrate. Therefore, a quality factor may be improved.

According to another aspect of the present disclosure, a method of manufacturing an acoustic resonator may allow for a simplified manufacturing process by simultaneously removing a first sacrificial layer for formation of the air gap and a second sacrificial layer for formation of the cavity through an etching process.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
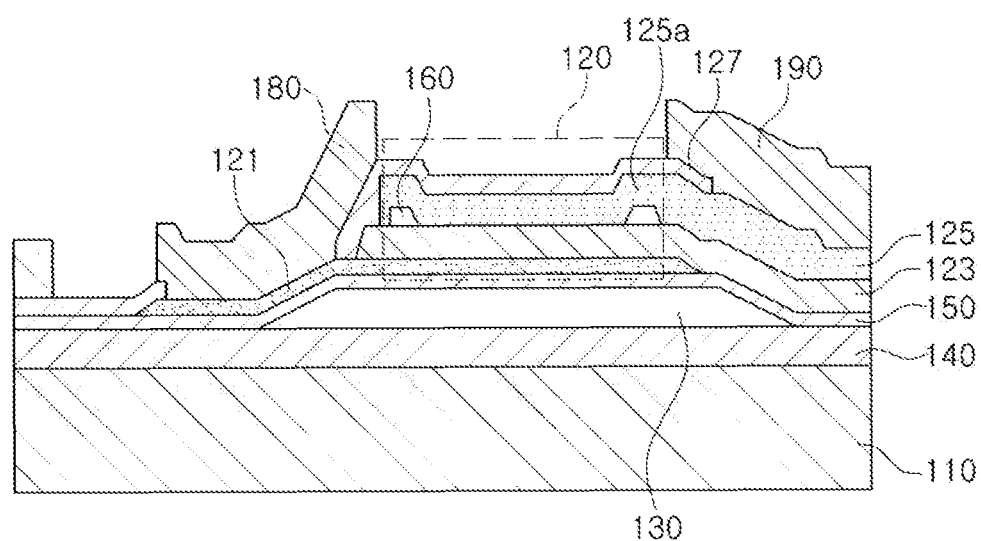
FIG. 1 is a cross-sectional view of an acoustic resonator according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Terms with respect to directions will be first defined. A longitudinal direction means a direction from a first electrode to a second electrode or a direction from the second electrode to the first electrode, and a transverse direction means a direction perpendicular to the longitudinal direction.

FIG. 1 is a cross-sectional view of an acoustic resonator according to an exemplary embodiment of the present disclosure.

Referring to FIG. 1, an acoustic resonator according to an exemplary embodiment of the present disclosure may include a substrate 110, an acoustic resonance unit 120, and an air gap 130. Since the air gap 130 is formed between the substrate 110 and the acoustic resonance unit 120, and the acoustic resonance unit 120 is formed on a membrane layer 150, the acoustic resonance unit 120 may be formed to be spaced apart from the substrate 110 by the air gap 130.

The substrate 110 may be formed of a silicon or silicon on insulator (SOI) type. The substrate 110 may have an etching stop layer 140 formed thereon.

The etching stop layer 140 may serve to protect the substrate 110 from an etching process and may serve as a base which is necessary to deposit various other layers on the etching stop layer 140.

The acoustic resonance unit 120 may include a first electrode 121, a piezoelectric layer 123, and a second electrode 125. The first electrode 121, the piezoelectric layer 123, and the second electrode 125 may be sequentially formed on the substrate 110. For example, the piezoelectric layer 123 may be disposed between the first electrode 121 and the second electrode 125.

Since the acoustic resonance unit 120 is formed on the membrane layer 150, the membrane layer 150, the first electrode 121, the piezoelectric layer 123, and the second electrode 125 may be sequentially formed on the substrate 110 as a result.

The acoustic resonance unit 120 may resonate the piezoelectric layer 123 depending on a signal applied to the first electrode 121 and the second electrode 125, to generate a resonance frequency and an antiresonance frequency.

The first electrode 121 and the second electrode 125 may be formed of a metal such as gold, molybdenum, ruthenium, aluminum, platinum, titanium, tungsten, palladium, chrome, nickel, or the like.

The acoustic resonance unit 120 may use acoustic waves of the piezoelectric layer 123. For example, if an RF signal is applied to the first electrode 121 and the second electrode 125, mechanical vibration may occur in a thickness direction of the piezoelectric layer 123 to generate acoustic waves.

Here, the piezoelectric layer 123 may include zinc oxide (ZnO), aluminum nitride (AlN), quartz, and the like.

A resonance phenomenon of the piezoelectric layer 123 may occur when a half of a wavelength of the applied RF signal matches a thickness of the piezoelectric layer 123. Since electrical impedance is sharply changed when the resonance phenomenon occurs, the acoustic resonator according to an exemplary embodiment of the present disclosure may be used as a filter capable of selecting a frequency.

The resonance frequency may be determined by the thickness of the piezoelectric layer 123, the first electrode 121 and the second electrode 125 that surround the piezoelectric layer 123, inherent acoustic wave velocity of the piezoelectric layer 123, and the like.

As an example, the more the thickness of the piezoelectric layer 123 is thin, the more the resonance frequency is increased.

The acoustic resonance unit 120 may further include a protection layer 127. The protection layer 127 may be formed on the second electrode 125 to prevent the second electrode 125 from being exposed to an external environment.

The first electrode 121 and the second electrode 125 may be formed to be extended to an outer side of the piezoelectric layer 123 and a first electrode pad 180 and a second electrode pad 190 may be each deposited on the extended portion.

The first electrode pad 180 and the second electrode pad 190 may serve to supply energy to the first electrode 121 and the second electrode 125, respectively.

The acoustic resonance unit 120 may be disposed to be spaced apart from the substrate 110 by the air gap 130 in order to improve a quality factor.

For example, by forming the air gap 130 between the acoustic resonance unit 120 and the substrate 110, acoustic waves generated by the piezoelectric layer 123 may not be affected by the substrate 110.

In addition, reflective characteristics of acoustic waves generated by the acoustic resonance unit 120 may be improved by the air gap 130. Since the air gap, which is an empty space, has impedance close to infinite, acoustic waves may not be lost by the air gap 130 and may remain in the acoustic resonance unit 120.

Therefore, by reducing loss of the acoustic wave in a longitudinal direction by the air gap 130, a quality factor value of the acoustic resonance unit 120 may be improved.

A cavity 160 may be formed between at least one of the first electrode 121 and the second electrode 125 and the piezoelectric layer 123.

In addition, the cavity 160 may be formed in a region in which the first electrode 121, the second electrode 125, and the piezoelectric layer 123 are overlapped with one another.

Specifically, the acoustic resonator according to an exemplary embodiment of the present disclosure may have an active region in which the first electrode 121, the second electrode 125, and the piezoelectric layer 123 are overlapped with one another, and the cavity 160 may be formed in the active region.

In addition, the cavity 160 may be formed to be positioned in an upper region of the air gap 130.

According to the present exemplary embodiment, a plurality of cavities 160 may be provided, and may be disposed to be spaced apart from each other and may be respectively positioned in edges of the acoustic resonance unit 120. For example, the plurality of cavities 160 may be respectively positioned in edges of the active region.

According to the present exemplary embodiment, the first electrode 121 may be formed on one surface of the piezoelectric layer 123 facing the air gap 130, the second electrode 125 may be formed on the other surface of the piezoelectric layer 123, and the plurality of cavities 160 may be formed between the second electrode 125 and the piezoelectric layer 123.

The plurality of cavities 160 may be formed by forming a sacrificial layer on the other surface of the piezoelectric layer 123, forming the second electrode 125 on the other surface of the piezoelectric layer 123 and the sacrificial layer, and then removing the sacrificial layer.

Therefore, the second electrode 125 may be formed to be stepped at the positions in which the plurality of cavities 160 are formed, and consequently, may have a relatively protruding shape. That is, the second electrode 125 may have a plurality of protrusion parts 125a formed thereon.

The plurality of protrusion parts 125a may be disposed in positions corresponding to the positions of the plurality of cavities 160, respectively. For example, the plurality of protrusion parts 125a may be provided in edges of the second electrode 125 in the active region.

The second electrode 125 may have the same thickness in the active region. That is, the portions of the second electrode 125 in which the plurality of protrusion parts 125a are formed and the remaining portions have the same thickness.

The acoustic resonator according to an exemplary embodiment of the present disclosure has the plurality of protrusion parts 125a formed in the second electrode 125 to allow the acoustic resonance unit 120 to have a cut-off frequency larger than an exciting frequency, whereby loss of acoustic waves in a transverse direction may be reduced and the quality factor value of the acoustic resonance unit 120 may be improved.

In addition, the acoustic resonator according to an exemplary embodiment of the present disclosure has the plurality of protrusion parts 125a formed in the second electrode 125 by the plurality of cavities 160 without changing the thickness of the second electrode 125, whereby the loss of acoustic waves in the transverse direction may be reduced and the quality factor value of the acoustic resonance unit 120 may be improved.

Figure 2:
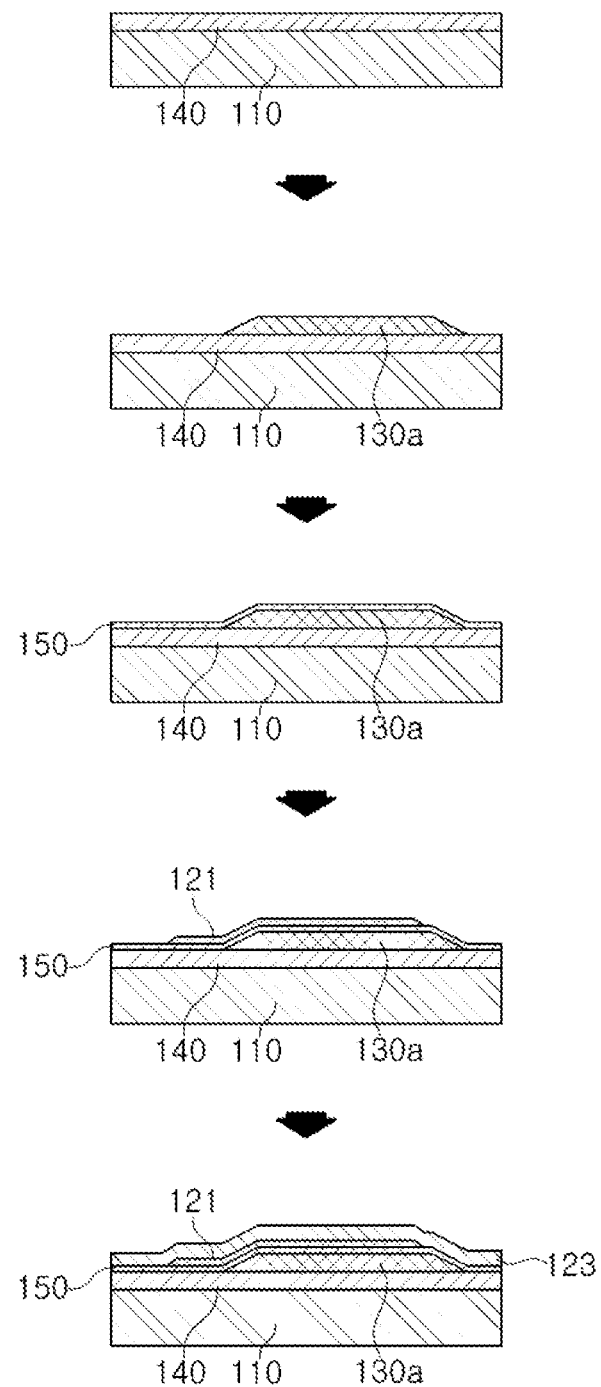
FIGS. 2 and 3 are flowcharts illustrating a method of manufacturing an acoustic resonator according to an exemplary embodiment of the present disclosure.
Figure 3:
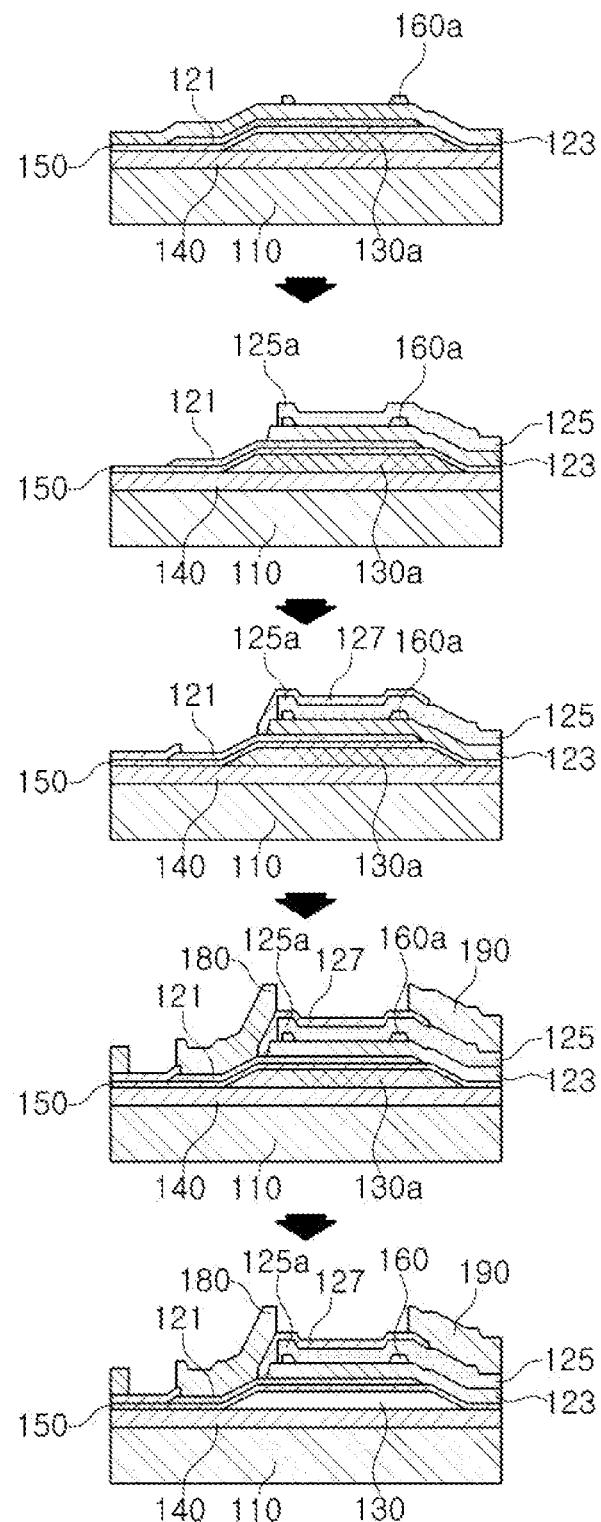

FIGS. 2 and 3 are flowcharts illustrating a method of manufacturing an acoustic resonator according to an exemplary embodiment of the present disclosure.

A method of manufacturing a piezoelectric resonator according to an exemplary embodiment of the present disclosure will be described with reference to FIGS. 2 and 3.

First, the etching stop layer 140 and a first sacrificial layer 130a may be sequentially formed on the substrate 110.

The etching stop layer 140 may serve to protect the substrate 110 when the first sacrificial layer 130 is removed in order to form the air gap 130. The etching stop layer 140 may include a silicon oxide film, a silicon nitride film, or the like.

The first sacrificial layer 130a may be removed by a later etching process and may be formed on the substrate 110 in order to form the air gap 130. The first sacrificial layer 130a may include polysilicon, polymer, or the like.

Next, the membrane layer 150 and the first electrode 121 may be sequentially formed on the etching stop layer 140 and the first sacrificial layer 130a.

The membrane layer 150 may be positioned on the air gap 130 to serve to maintain a shape of the air gap 130 and to support a structure of the acoustic resonance unit 120.

The first electrode 121 may be formed in a desired form by forming a conductive layer including a metal such as gold, molybdenum, ruthenium, aluminum, platinum, titanium, tungsten, palladium, chrome, nickel, or the like on the membrane layer 150, depositing a photoresist on the conductive layer, performing a patterning through a photolithography process, and then using the patterned photoresist as a mask.

Next, the piezoelectric layer 123 may be formed on the first electrode 121 and a second sacrificial layer 160a may be formed on the piezoelectric layer 123.

Here, the second sacrificial layer 160a may be removed through a later etching process and may be formed on the piezoelectric layer 123 in order to form the plurality of cavities 160. The second sacrificial layer 160a may be formed of a metal including molybdenum.

The second sacrificial layer 160a may be formed in a portion in which the first electrode 121 and the piezoelectric layer 123 are overlapped with each other, and may be formed to be positioned in an upper region of the first sacrificial layer 130a.

Next, the second electrode 125 may be formed on the piezoelectric layer 123 and the second sacrificial layer 160a.

The second electrode 125 may be formed in a desired form by forming a conductive layer including a metal such as gold, molybdenum, ruthenium, aluminum, platinum, titanium, tungsten, palladium, chrome, nickel, or the like on the piezoelectric layer 123 and the second sacrificial layer 160a, depositing a photoresist on the conductive layer, performing a patterning through a photolithography process, and then using the patterned photoresist as a mask.

The second electrode 125 may be formed to have the protrusion part 125a in a position corresponding to the second sacrificial layer 160a.

Next, the protection layer 127 may be formed on the second electrode 125, and the first electrode pad 180 and the second electrode pad 190 that supply electrical energy to the first electrode 121 and the second electrode 125, respectively, may be formed.

The protection layer 127 may be formed of an insulating material, wherein the insulating material may include silicon oxide based, silicon nitride based, and aluminum nitride based materials.

Next, the air gap 130 and the plurality of cavities 160 may be implemented by removing the first sacrificial layer 130a and the second sacrificial layer 160a through an etching process.

For example, the air gap 130 and the plurality of cavities 160 may be formed by simultaneously removing the first sacrificial layer 130a and the second sacrificial layer 160a through a dry etching process.

Therefore, an additional process for forming the plurality of cavities 160 may not be required, and the plurality of cavities 160 may be simultaneously formed while the air gap 130 may be formed.

Figure 4:
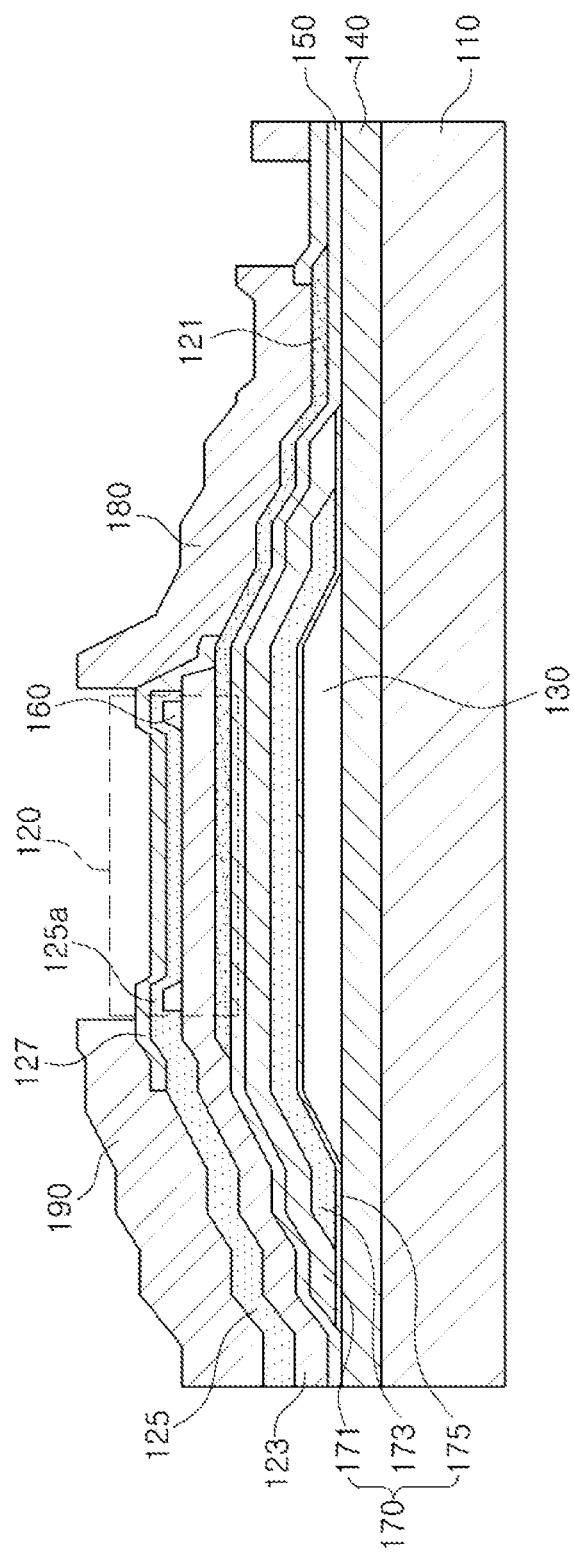
FIG. 4 is a cross-sectional view of an acoustic resonator according to another exemplary embodiment of the present disclosure.

FIG. 4 is a cross-sectional view of an acoustic resonator according to another exemplary embodiment of the present disclosure.

Referring to FIG. 4, since an acoustic resonator according to another exemplary embodiment of the present disclosure is the same as the acoustic resonator according to an exemplary embodiment of the present disclosure as described above, except that it further includes a plurality of reflective layers 170, only a description of the plurality of reflective layers 170 will be provided.

The plurality of reflective layers 170 may be formed between the acoustic resonance unit 120 and the air gap 130.

The plurality of reflective layers 170 may be formed in a coupled structure of reflective layers 171, 173, and 175 having at least two characteristics. The plurality of reflective layers 170 may each have acoustic impedances of different magnitudes.

In the case in which acoustic waves occurred in the longitudinal direction is incident on the plurality of reflective layers 170, acoustic waves may be reflected by interfaces of the plurality reflective layers 170 having a difference in acoustic impedance.

Therefore, the loss of acoustic waves occurred in the longitudinal direction is reduced, such that the quality factor value of the acoustic resonance unit may be more improved.

Figure 5:
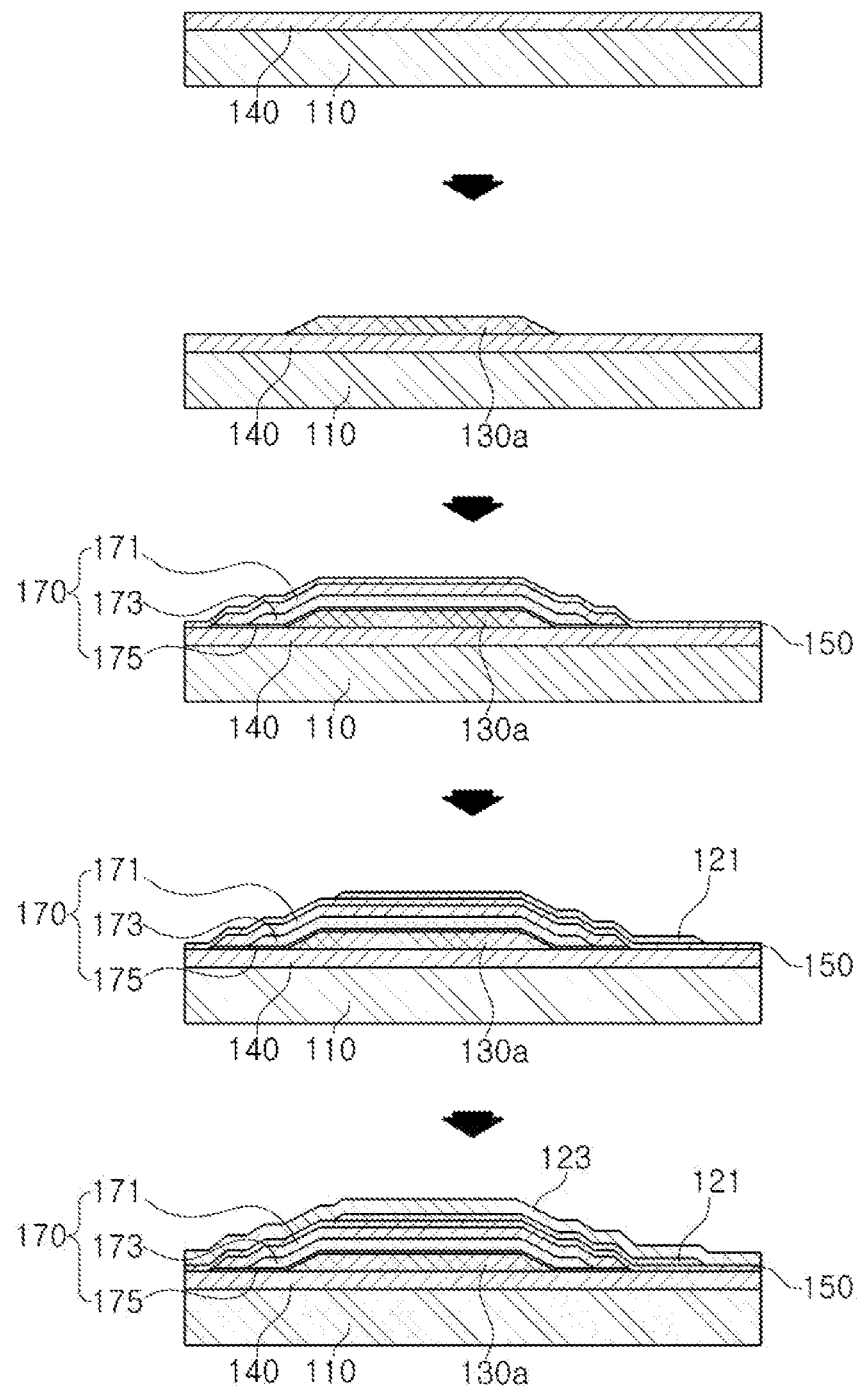
FIGS. 5 and 6 are flowcharts illustrating a method of manufacturing an acoustic resonator according to another exemplary embodiment of the present disclosure.
Figure 6:
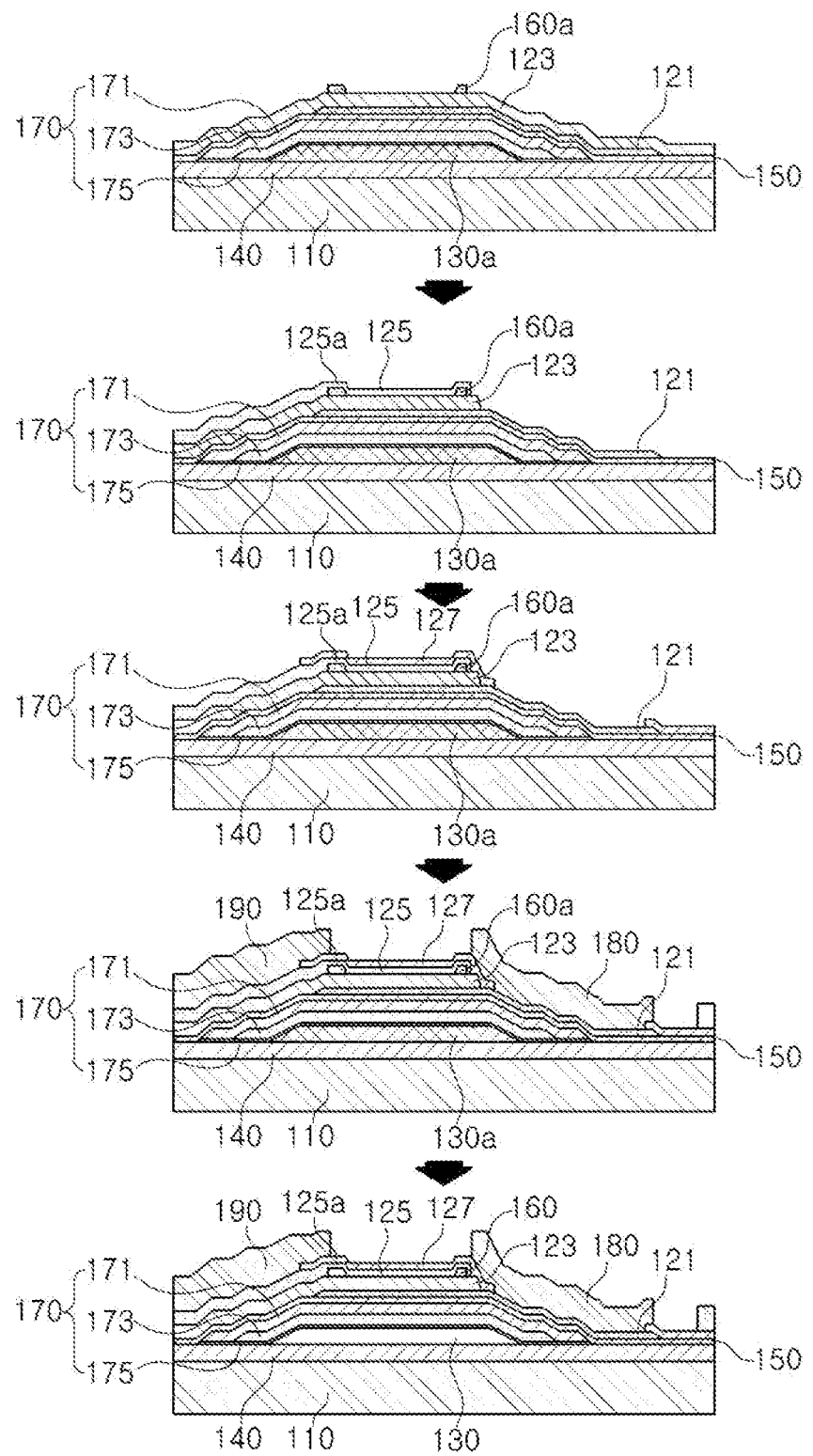

FIGS. 5 and 6 are flowcharts illustrating a method of manufacturing an acoustic resonator according to another exemplary embodiment of the present disclosure.

Referring to FIGS. 5 and 6, in a method of manufacturing an acoustic resonator according to another exemplary embodiment of the present disclosure, the plurality of reflective layers 170 may be sequentially formed on the etching stop layer 140 and the first sacrificial layer 130a, and the membrane layer 150 and the first electrode 121 may be then formed on the plurality of reflective layers 170.

That is, as compared to the method of manufacturing the acoustic resonator according to an exemplary embodiment of the present disclosure, a process of forming the plurality of reflective layers 170 may be performed before forming the membrane layer 150 and the first electrode 121 on the etching stop layer 140 and the first sacrificial layer 130a.

As set forth above, according to exemplary embodiments of the present disclosure, the acoustic resonator and the method of manufacturing the same may reduce loss of acoustic waves in the longitudinal direction and the transverse direction and improve a quality factor.

While exemplary embodiments have been shown and described above, it will be apparent to those skilled in the art that modifications and variations could be made without departing from the scope of the present invention as defined by the appended claims.

What is claimed is:

1. An acoustic resonator comprising:
an acoustic resonance unit comprising a first electrode, a second electrode, and a piezoelectric layer positioned between the first electrode and the second electrode;
a substrate provided below the acoustic resonance unit; and
an air gap formed between the acoustic resonance unit and the substrate and reflecting acoustic waves generated by the acoustic resonance unit, wherein at least one of the first electrode and the second electrode, and the piezoelectric layer have a plurality of cavities formed therebetween, wherein the acoustic resonator has an active region in which the first electrode, the piezoelectric layer, and the second electrode are formed in an overlapping manner with each other; and wherein the plurality of cavities are formed in the active region.

2. The acoustic resonator of claim 1, wherein the plurality of cavities are formed in a region in which the first electrode, the second electrode, and the piezoelectric layer are overlapped with one another.

3. The acoustic resonator of claim 2, wherein the plurality of cavities are respectively positioned in edges of the region in which the first electrode, the second electrode, and the piezoelectric layer are overlapped with one another.

4. The acoustic resonator of claim 1, wherein the plurality of cavities are positioned in an edge of the acoustic resonance unit.

5. The acoustic resonator of claim 1, wherein the second electrode has a protrusion part protruded therefrom.

6. The acoustic resonator of claim 5, wherein the protrusion part is disposed in a position corresponding to a position in which the plurality of cavities are formed.

7. The acoustic resonator of claim 1, wherein the first electrode is formed on one surface of the piezoelectric layer facing the air gap and the second electrode is formed on the other surface of the piezoelectric layer.

8. The acoustic resonator of claim 7, wherein the plurality of cavities are formed between the second electrode and the piezoelectric layer.

9. The acoustic resonator of claim 8, wherein the plurality of cavities are formed to be spaced apart from each other.

10. The acoustic resonator of claim 9, wherein the second electrode includes a plurality of protrusion parts in portions in which the plurality of cavities are formed.

11. The acoustic resonator of claim 10, wherein portions, in which the protrusion parts are formed, of the second electrode and the remaining portions of the second electrode have the same thickness.

12. The acoustic resonator of claim 1, further comprising a plurality of reflective layers provided between the acoustic resonance unit and the air gap.

13. The acoustic resonator of claim 12, wherein the plurality of reflective layers have different levels of acoustic impedance.

14. An acoustic resonator comprising:
an acoustic resonance unit including a piezoelectric layer, a first electrode formed on one surface of the piezoelectric layer, and a second electrode formed on the other surface of the piezoelectric layer;
a substrate provided below the acoustic resonance unit; and
an air gap provided between the acoustic resonance unit and the substrate and reflecting acoustic waves generated by the acoustic resonance unit,
wherein an active region in which the piezoelectric layer, the first electrode, and the second electrode are overlapped with one another is positioned in an upper region of the air gap, and
the active region has a plurality of cavities formed therein.

15. The acoustic resonator of claim 14, wherein the acoustic resonance unit has a plurality of protrusion parts provided in portions corresponding to portions in which the plurality of cavities are formed.

* * * * *